United States Patent
Fukuoka et al.

(10) Patent No.: US 10,422,032 B2
(45) Date of Patent: Sep. 24, 2019

(54) FILM FORMATION APPARATUS AND FILM-FORMED WORKPIECE MANUFACTURING METHOD

(71) Applicant: SHIBAURA MECHATRONICS CORPORATION, Yokohama-shi, Kanagawa (JP)

(72) Inventors: Yotaro Fukuoka, Yokohama (JP); Sosuke Yagi, Yokohama (JP)

(73) Assignee: SHIBAURA MECHATRONICS CORPORATION, Yokohama-Shi, Kanagawa (JP)

( * ) Notice: Subject to any disclaimer, the term of this patent is extended or adjusted under 35 U.S.C. 154(b) by 111 days.

(21) Appl. No.: 15/308,638

(22) PCT Filed: Feb. 29, 2016

(86) PCT No.: PCT/JP2016/056079
§ 371 (c)(1),
(2) Date: Nov. 3, 2016

(87) PCT Pub. No.: WO2016/152395
PCT Pub. Date: Sep. 29, 2016

(65) Prior Publication Data
US 2017/0183769 A1    Jun. 29, 2017

(30) Foreign Application Priority Data
Mar. 20, 2015  (JP) .................. 2015-057784

(51) Int. Cl.
*C23C 14/04*  (2006.01)
*C23C 14/54*  (2006.01)
(Continued)

(52) U.S. Cl.
CPC ............ *C23C 14/542* (2013.01); *C23C 14/34* (2013.01); *C23C 14/505* (2013.01);
(Continued)

(58) Field of Classification Search
CPC .................................................. H01J 37/32715
See application file for complete search history.

(56) References Cited

U.S. PATENT DOCUMENTS

2007/0034148 A1* 2/2007 Lin ...................... C23C 14/505
118/230
2010/0276283 A1* 11/2010 Muenz ............. H01J 37/32055
204/298.14

FOREIGN PATENT DOCUMENTS

| JP | H11-302840 A | 11/1999 |
| JP | 2011-94163 A | 5/2011 |
| JP | 2013-227625 A | 11/2013 |

OTHER PUBLICATIONS

International Search Report dated Apr. 26, 2016 issued in corresponding International Application No. PCT/JP2016/056079.

* cited by examiner

*Primary Examiner* — Jason Berman
(74) *Attorney, Agent, or Firm* — Nath, Goldberg & Meyer; Jerald L. Meyer; Stanley N. Protigal

(57) ABSTRACT

A film formation apparatus and a film-formed workpiece manufacturing method which are capable of forming a film with a uniform thickness on a workpiece like a three-dimensional object that includes a plurality of surfaces by a simple structure are provided. A film formation apparatus includes a target 21 that is a film formation material including a plane SU3, a power supply unit 3 applying power to the target 21, a rotating unit 4 rotating a workpiece W that is a film formation object around a rotation axis AX1, and a revolving unit 5 revolving the rotating unit 4 around a revolution axis AX2 separate from the rotation axis AX1 to repeatedly make the workpiece W to come close to and move apart from the target 21.

16 Claims, 10 Drawing Sheets

(51) Int. Cl.
*C23C 14/34* (2006.01)
*C23C 14/50* (2006.01)
*H01J 37/32* (2006.01)
*H01J 37/34* (2006.01)

(52) U.S. Cl.
CPC .. *H01J 37/32403* (2013.01); *H01J 37/32715* (2013.01); *H01J 37/32733* (2013.01); *H01J 37/347* (2013.01); *H01J 37/3417* (2013.01); *H01J 2237/332* (2013.01)

| | FIRST INCLINATION ANGLE [°] | SECOND INCLINATION ANGLE [°] | ANGLE BETWEEN ROTATION TRAJECTORY SURFACE AND TARGET WHEN COMING CLOSEST [°] | FILM FORMATION CONDITION |
|---|---|---|---|---|
| COM-PARATIVE EXAMPLE | 0 | 0 | 180 | × |
| ↑ | ↑ | ↑ | ↑ | ↑ |
| FIRST EXAMPLE | 40 | 40 | 100 | ◎ |
| ↓ | ↓ | ↓ | ↓ | ↓ |
| SECOND EXAMPLE | 45 | 45 | 90 | ○ |

FIG. 9

FILM FORMATION APPARATUS AND FILM-FORMED WORKPIECE MANUFACTURING METHOD

This is a National Phase Application filed under 35 U.S.C. 371 as a national stage of PCT/CN2016/056079, filed Feb. 29, 2016, an application claiming the benefit of Japanese Application No. 2015-057784, filed Mar. 20, 2015, the content of each of which is hereby incorporated by reference in its entirety.

TECHNICAL FIELD

The present disclosure relates to a film formation apparatus and a film-formed workpiece manufacturing method.

BACKGROUND ART

Film formation apparatuses by sputtering are widely used as apparatuses forming a film on the surface of a workpiece such as a substrate. Sputtering is a technology for applying, to the workpiece, particles of film formation material, which are driven out by a collision of a target that is the film formation material and ions generated by a plasma gasification of a gas introduced into a chamber.

As to such sputtering, it is desirable for the film formed to have a uniform thickness relative to the workpiece. When, for example, a film formation object is a planar workpiece such as a semiconductor wafer, and the film formation subjected surface is only one plane, in general, the target is disposed so as to face the workpiece parallel. Next, an attempt to obtain a uniform film thickness within the plane is performed by disposing a plurality of targets to adjust a voltage applied to each targets, or by adjusting a distance of the target and the film formation subjected material.

CITATION LIST

Patent Literatures

Patent Document 1: JP2011-94163 A

SUMMARY OF INVENTION

Technical Problem

However, a workpiece in which the film formation subjected, surface is not only one plane may be applied in some cases. For example, the film formation subjected planes may be a plurality of planes and curved surfaces of three-dimensional objects like a polygonal body including a plurality of planes, such as a cube or a cuboid, a curved surface body including one or a plurality of curved surfaces, such as a semi-spherical shape, a domical shape or a bowl-like shape, and a composite body including a curved surface and a plane, such as a rectangular cylinder, a cylinder or a cone. Hereinafter, the workpiece that has a plurality of such film formation subjected surfaces will be referred to as a three-dimensional object, and is distinguished from the workpiece that has the film formation subjected surface with only one plane. As to such three-dimensional objects, the distance between the target and the film formation subjected surface and the angle therebetween are not uniform, and achieving a uniform film thickness, by an adjustment of the voltage applied to the target and an adjustment of the distance between the target and the workpiece, is difficult.

In order to address this difficulty, like Patent Document 1, a technology of improving an uniformity of the film thickness by turning the three-dimensional object and changing the angle, relative to the horizontally disposed target during the film formation has been proposed. According to this conventional technology, the reason why the workpiece is turned during the film formation is as follows. Sputtering is a technology of forming a film by applying particles driven out from the target. Hence, particles are sufficiently applied on a surface facing toward the target. When the workpiece is in a planar shape like a semiconductor wafer, since the film formation subjected surface is only a plane that is entirely flat, by directing only this surface to be in parallel with the target, a relatively uniform film thickness can be obtained. In this case, the surface facing toward the target is a film formation subjected surface that has an inclination angle of smaller than 90 degrees relative to the sputter surface that is the surface of the target.

On the other hand, when the workpiece is an object like the three-dimensional object having a plurality of surfaces, and when there are a surface facing towards the target and a surface not facing toward the target among the plurality of film formation subjected surfaces that have different angles, film formation is hardly obtained on the surface not facing towards the target. In this case, uniform film formation cannot be obtained on the entire plurality of film formation subjected surfaces. Hence, the angle of the workpiece may be inclined so as to face each film formation subjected surface towards the target. In this case, however, when the two film formation subjected surfaces are in a two-sided relationship, both film formation subjected surfaces cannot be simultaneously face towards the target. Hence, by rotating or revolving the inclined workpiece, a time at which all film formation subjected surfaces are facing toward the target is obtained.

Even if the workpiece is inclined, rotated and revolved in this way, however, when the angle of the rotation axis is constant, there will be a film formation subjected surface that always face towards the target, and a film formation subjected surface that repeats a condition of facing towards the target and not facing towards the target, and thus a difference in the film formation amount is caused between those film formation subjected surfaces. In order to address this problem, according to conventional technologies, a film thickness is detected during the film formation, and the angle of the rotation axis of the workpiece relative to the target is changed during the film formation to achieve a detected film thickness with a desired film thickness. However, a mechanical component and a control component which detect the film thickness, determine the optimized angle relative to the target, and adjust an angle, to achieve the uniform film thickness, during the film formation is quite complicated.

The present disclosure has been proposed in order to address the technical problems of conventional technologies, and an objective is to provide a film formation apparatus and a film-formed workpiece manufacturing method in a simple structure, which are capable of forming a film with a uniform thickness on a workpiece like a three-dimensional object that includes a plurality of surfaces.

Solution to Problem

In order to achieve the above objective, a film formation apparatus according to an embodiment of the present disclosure includes:

a target that is a film formation material including a plane;

a power supply unit applying power to the target;

a rotating unit rotating a workpiece that is a film formation object around a rotation axis; and a revolving unit revolving the rotating unit around a revolution axis separate from the rotation axis to repeat the workpiece to come close to and move apart from the target, wherein:

the rotation axis in the rotation and the revolution is fixed in an angle making a rotation trajectory surface orthogonal to the rotation axis to have a first inclination angle relative to a revolution trajectory surface orthogonal to the revolution axis; and the target is fixed in an angle that makes the plane to have a second inclination angle relative to the revolution trajectory surface.

The first inclination angle may be an angle that makes the rotation axis to be not in parallel with the plane of the target at a position where the rotating unit comes closest to the target. The first inclination angle may be in an angle that makes the rotation trajectory surface to be in parallel with the plane of the target at a position where the rotating unit becomes most distant from the target. The first inclination angle and the second inclination angle may be a same angle.

A rotation speed of the workpiece by the rotating unit may be faster than a revolution speed of the workpiece by the revolution unit. A plurality of the targets may be provided. A plurality of the rotating units may be provided. The rotating unit may have a position that is in orthogonal direction to the revolution axis to be variable. The first inclination angle may be variable.

Note that the above aspect can be considered as a method of manufacturing a film-formed workpiece. That is, a film-formed workpiece manufacturing method according to the present disclosure includes:

a step of rotating a workpiece that is a film formation object supported by a rotation axis of a rotating unit around the rotation axis, while revolving the rotating unit by a revolving unit that supports the rotating unit around a revolution axis separate from the rotation axis; and a step of depositing the film formation material on a film formation subjected surface of the workpiece by applying power to a target that is a film formation material from a power supply unit to generate plasma from a sputtering gas introduced around a plane of the target, wherein a rotation trajectory surface orthogonal to the rotation axis has a first inclination angle fixed in a film formation and relative to a revolution trajectory surface orthogonal to the revolution axis; and the target is fixed in an angle that makes the plane to have a second inclination angle relative to the revolution trajectory surface.

Advantageous Effects of Invention

According to the present disclosure, a film formation apparatus and a film-formed workpiece manufacturing method which are capable of forming a film with a uniform thickness on a workpiece like a three-dimensional object that includes a plurality of surfaces by a simple structure are provided.

BRIEF DESCRIPTION OF DRAWINGS

FIG. 9 is an explanatory diagram illustrating a relationship between the angle of the workpiece relative to the target, and a film formation condition;

DESCRIPTION OF EMBODIMENTS

An embodiment of the present disclosure (hereinafter, referred to as the embodiment) will be explained below in detail with reference to the figures.

[Workpiece]

First, a workpiece that is a film formation object according to the embodiment is a three-dimensional object that includes a plurality of film formation subjected surfaces. Such workpiece includes various polygonal bodies, curved surface bodies and composite bodies used for exterior components, containers, casings, and covers, etc. Since a curved surface can be considered as a collection of a large number of lines that have different angles, a curved surface can be considered as including a plurality of surfaces.

Figure 1:
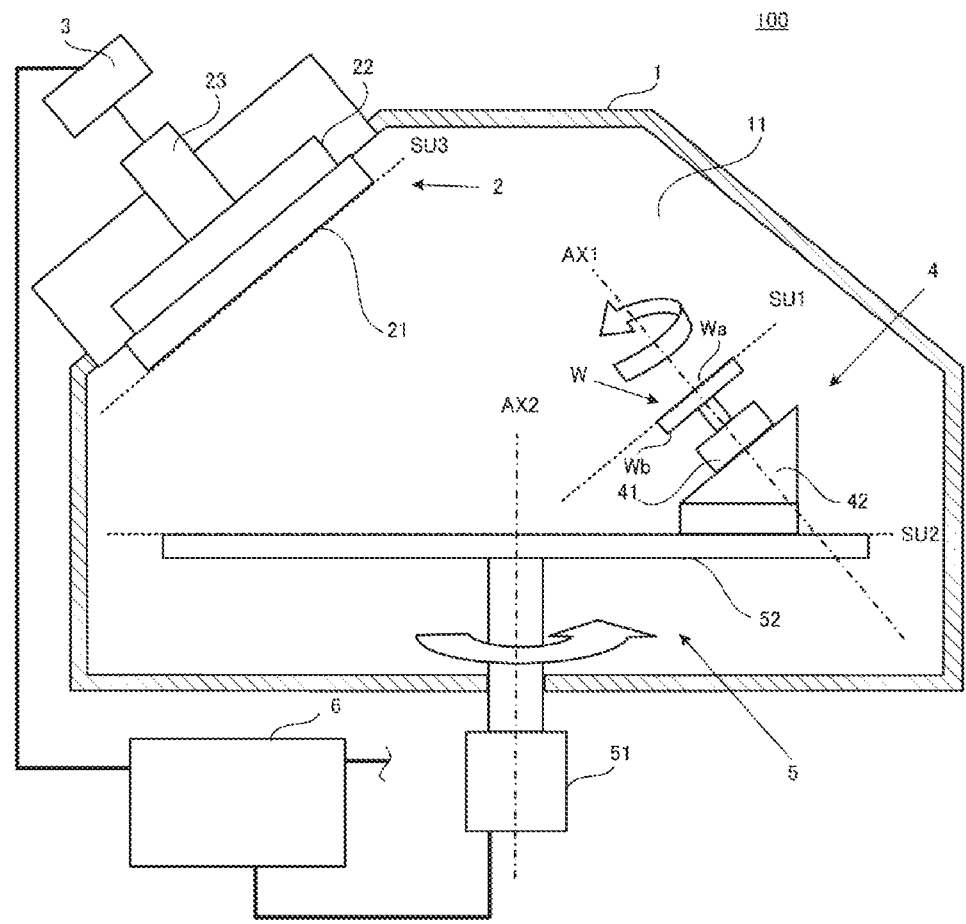
FIG. 1 is a simplified cross-sectional view of a film formation apparatus according to an embodiment.

In the following explanation, as illustrated in FIG. 1, an explanation will be given of an example case in which a three-dimensional object, which is in a cylindrical shape having a bottom in a way the bottom is orthogonal to a side surface, is applied as a workpiece W for a film formation. In this case, the outer bottom of the workpiece W is a film formation subjected surface Wa that is a plane, and the outer side surface is a film formation subjected surface Wb that is a curved surface. In addition, the workpiece having undergone the film formation will be referred to as a film-formed workpiece, and the embodiment can also be considered as a film-formed workpiece manufacturing method.

[Film Formation Apparatus]

As illustrated in FIG. 1, a film formation apparatus 100 according to the embodiment includes a chamber 1, a sputter source 2, a power supply unit 3, a rotating unit 4, a revolving unit 5, and a control apparatus 6.

(Chamber)

The chamber 1 is a container into which a sputtering gas is introduced. The sputtering gas is a gas for carrying out sputtering. Sputtering is a technology for depositing to the film formation subjected surface particles of the film formation material, which are driven out by colliding the film formation material and, for example, ions produced from the sputtering gas by plasma generated by the power applied to the film formation material. An exemplary sputtering gas applicable is argon gas.

The internal space of the chamber 1 forms a vacuum chamber 11. The vacuum chamber 11 is a gas tight space that becomes a vacuumed condition by depressurization. Although not illustrated in the figure, the chamber 1 includes an outlet port and an inlet port. The outlet port is an opening that ensures the gas flow between the vacuum chamber 11 and the exterior for discharging. Although not illustrated in the figure, the outlet port is connected to a discharging unit that includes a piping, a pump, and a valve, etc. By the discharge process executed by the discharging unit, the vacuum chamber 11 is depressurized.

The inlet port is an opening for introducing the sputtering gas into the vacuum chamber 11. Although not rust rated in the figure, the inlet port is connected to a gas supplying unit that includes a piping, the sputtering gas supplying source, a pump, and a valve, etc. The gas supplying unit introduces the sputtering gas into the vacuum chamber 11 via the inlet port.

In addition, the chamber 1 includes an unillustrated load locking unit. The load locking unit is an apparatus that conveys the unprocessed workpiece W into the vacuum chamber 11 from the exterior by a conveyor, and ejects the processed workpiece W to the exterior from the vacuum chamber 11 with the vacuum condition of the vacuum chamber 11 being maintained. The load locking unit is capable of employing a conventionally well-known structure, and thus the explanation thereof will be omitted.

(Sputter Source)

The sputter source 2 is a supply source of the film formation material which will be deposited on the workpiece W to form a film. The sputter source 2 includes a target 21, a backing plate 22, and a conductor 23. The target 21 is a film formation material that has a plane. In FIG. 1, the plane and the angle (direction) thereof are indicated as SU3.

The target 21 is provided at an angle that directs the plane SU3 towards the workpiece W in the vacuum chamber 11. The attachment location of the target 21 is, for example, the ceiling of the vacuum chamber 11. Exemplary film formation materials applicable are titanium and silicon. However, any kinds of conventionally well-known materials applicable for film formation by sputtering may also be applied. For example, the target 21 is in a cylindrical shape. However, the target may be in other shapes, such as an elongated cylindrical shape, and a rectangular cylindrical shape. The plane SU3 is a surface so-called a sputtering surface where ions produced by plasma collide at the time of sputtering.

The backing plate 22 is a member that holds the opposite surface of the plane SU3 of the target 21. The conductor 23 is a member that applies power to the target 21 via the backing plate 22 from the exterior of the chamber 1. Note that the sputter source 2 is provided with a magnet, a cooling mechanism, etc., as necessary.

(Power Supply Unit)

The power supply unit 3 is a component that applies power to the target 21. That is, the power supply unit 3 changes the sputtering gas introduced around the plane SU3 of the target 21 to be plasma by applying power to the target 21, and deposits the film formation material on the workplace W. The power supply unit 3 in the embodiment is, for example, a DC power supply that applies a high voltage. In the case of an apparatus that executes a high-frequency sputtering, an RF power supply may be applied.

(Rotating Unit)

Figure 2:
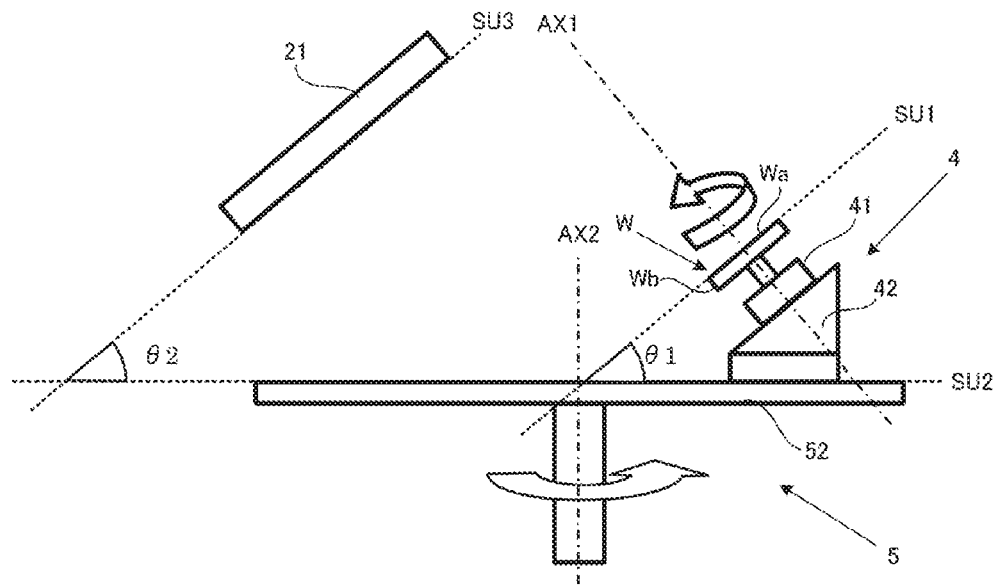
FIG. 2 is a simplified cross-sectional view illustrating a positional relationship between a target and a workpiece according to an embodiment.
Figure 3:
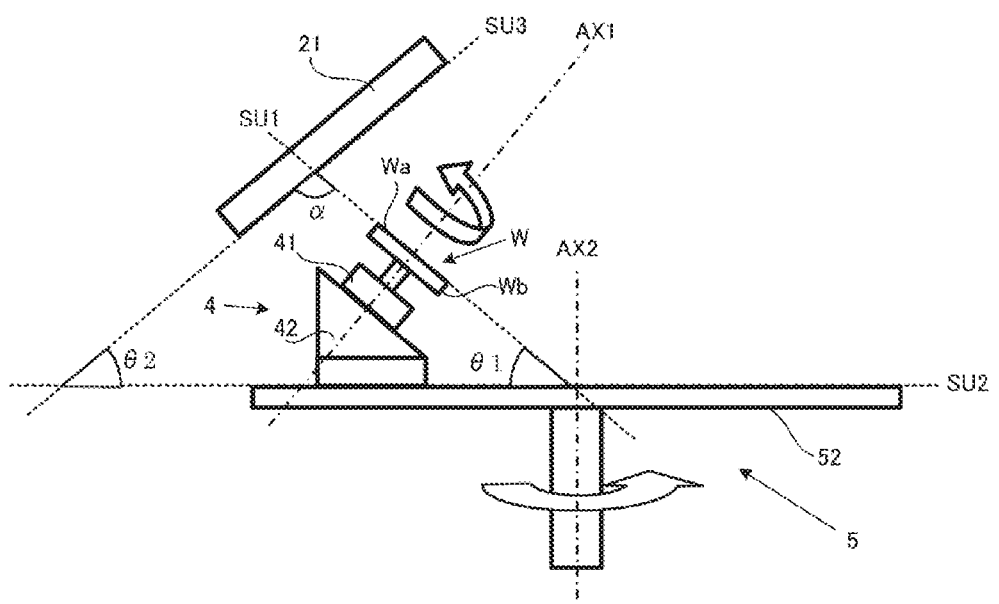
FIG. 3 is a simplified cross-sectional view illustrating a positional relationship between the target and the workpiece according to an embodiment.

The rotating unit 4 is a component that rotates the workpiece W around a rotation axis AX1. The rotation is to turn around an axial line that intersects the workpiece W. The axis of this turning will be referred to as the rotation axis AX1. In addition, a plane orthogonal to the rotation axis AX1 will be referred to as a rotation trajectory surface. In FIGS. 2, 3, the rotation trajectory surface and the angle (direction) thereof are indicated as SU1.

The rotating unit 4 includes a driving unit 41, and a support 42. The driving unit 41 is an apparatus that rotates and drives a turning shaft. This turning shaft is coaxial with the rotation axis AX1. An exemplary driving unit 41 is a motor.

The support 42 is an apparatus that fixes the driving unit 41 in an angle that makes the turning shaft of the driving unit 41 to be inclined relative to the revolution trajectory surface (SU2 in FIGS. 2, 3) to be explained later. For example, the driving unit 41 is attached to the inclined surface of the support 42. Note that as for the attachment to the turning shaft, the workpiece W may be attached to the turning shaft using, for example a fixing jig.

(Revolving Unit)

The revolving unit 5 is a component that revolves the rotating unit 4 around a revolution axis AX2 which is separate from the rotation axis AX1, to repeatedly make the workpiece W to come close to and move apart from the target 21. The revolution is a turning of the rotating unit 4 around the axial line that does not intersect the workpiece W. This turning shaft will be referred to as the revolution axis AX2. In addition, the orthogonal plane to the revolution axis AX2 will be referred to as a revolution trajectory surface. In the following explanation, the revolution trajectory surface and the angle (direction) thereof are indicated as SU2.

The revolving unit 5 includes a driving unit 51, and a turning member 52. The driving unit 51 is an apparatus that turns and drives the turning shaft. The turning shaft is coaxial with the revolution axis AX2. An exemplary driving unit 51 is a motor. The turning member 52, is a member to which the turning shaft of the driving unit 51 and the rotating unit 4 are attached, and revolves the rotating unit 4 by the turning of the turning shaft.

An exemplary turning member 52 is a turn table in a circular disk shape. In this case, for example, the turning shaft of the driving unit 51 is connected to the center of the turn table, and the rotating unit 4 is fixed to an eccentric location on the upper surface of the turn table.

(Angle Setting)

The angle setting for each of the above components will be explained with reference to FIGS. 2, 3. First, the rotation trajectory surface SU1 of the rotating unit 4 has a first inclination angle $\theta 1$ relative to the revolution trajectory surface SU2. In addition, the plane SU3 of the target 21 has a second inclination angle $\theta 2$ relative to the revolution trajectory surface SU2. The first inclination angle $\theta 1$ and the second inclination angle $\theta 2$ are greater than 0 degree, but smaller than 90 degrees. Preferably, these angles are greater than 0 degree but are equal to or smaller than 45 degrees, as will be explained later.

(Control Apparatus)

The control apparatus 6 is an apparatus that controls each component of the film formation apparatus 100. The control apparatus 6 is configured by, for example, a designated electronic circuit or a computer that runs a predetermined program. That is, as for the control on the introduction of the sputtering gas into the vacuum chamber 11 and the discharging therefrom, the control on the power supply unit 3, and the control on the driving units 41, 51, etc., the control details are programmed, and are executed by a processing apparatus such as a PLC or a CPU. Hence, the control apparatus is compatible with various kinds of film formation specifications.

Example specific control details include the initial discharging pressure, the applied power to the target 21, the flow rate, type, introduction time and discharging time of the sputtering gas, the film formation time, the revolution speed, and the rotation speed.

Figure 4:
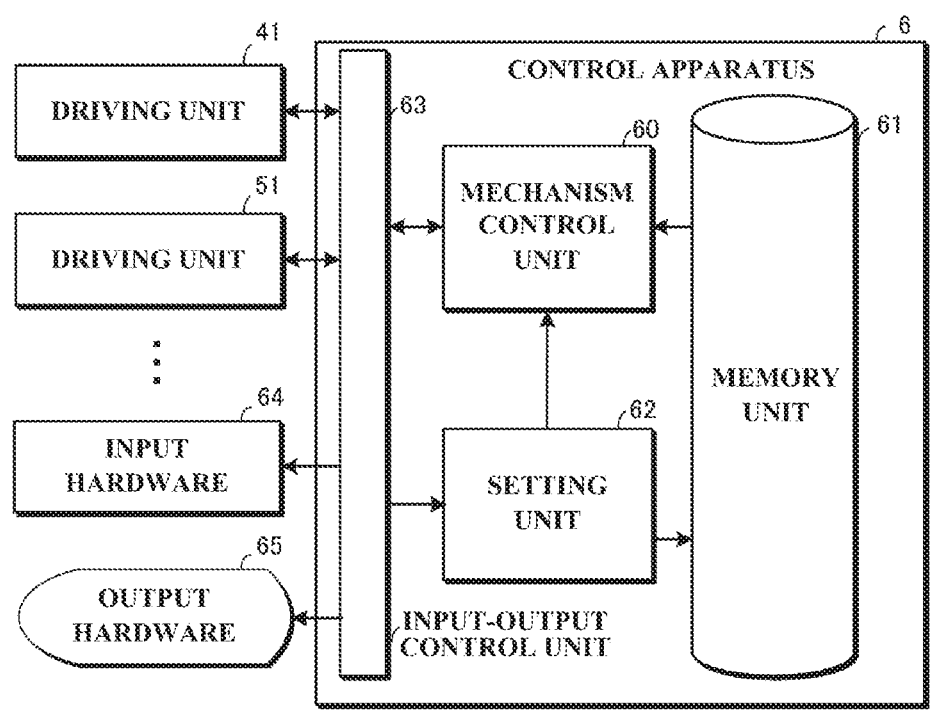
FIG. 4 is a block diagram illustrating a control apparatus according to an embodiment.

The structure of such control apparatus 6 will be explained with reference to FIG. 4 that is a virtual functional block diagram. That is, the control apparatus 6 includes a mechanism control unit 60, a memory unit 61, a setting unit 62, and an input-output control unit 63.

The mechanism control unit 60 is a processing unit that controls the discharging unit, the gas supplying unit, the load locking unit, the power supply unit 3, the respective driving units 41, 51 of the rotating unit 4 and the revolving unit 5, the valve, the switch, and the power supply, etc. In the embodiment, the mechanism control unit 60 controls the driving unit 41 of the rotating unit 4 and the driving unit 51 of the revolving unit 5 in such way that the rotation speed (the number of turns per a unit time, it is the same in the following explanation) becomes faster than the revolution speed. That is, the control is performed in such way that every time a revolution is made, the rotation more than a turn is made.

The memory unit 61 is a component that stores necessary information for the control according to the embodiment, such as the rotation speed, and the revolution speed. The setting unit 62 is a processing unit that sets information input from the exterior in the memory unit 61. The input-output control unit 63 is an interface that controls signal conversion and input-output with each unit that is to be controlled.

In addition, the control apparatus 6 is connected to an input hardware 64 and an output hardware 65. The input hardware 64 is an inputter including a switch, a touch panel, a keyboard, and a mouse for an operator to operate the film formation apparatus 100 via the control apparatus 6. As for the above rotation speed and revolution speed, a desired value can be input from the input hardware 64.

The output hardware 65 is an outputter, such as a display, a lamp and a meter, which makes information for checking the status of the apparatus visually recognizable for the operator. The above rotation speed and the revolution speed may be displayed on the output hardware 65.

[Action]

(Film Formation Process)

The film formation process according to the embodiment above will be explained below. First, the conveyor of the load locking unit conveys the workpiece W to the film formation process in the vacuum chamber 11 of the chamber 1, and the turning member 52 of the revolving unit 5 moves the rotating unit 4 to a convey location from the load locking unit. The conveyor attaches the conveyed workpiece W to the turning shaft of the driving unit 41 of the rotating unit 4.

The discharging unit degasses and depressurizes the vacuum chamber 11, to achieve a vacuumed condition. The gas supplying unit feeds the sputtering gas to the vacuum chamber 11, and thus the surroundings of the plane SU3 of the target 21 will be in the sputtering gas atmosphere. Next, the rotating unit 4 starts rotating the workpiece W, and the revolving unit 5 starts revolving the rotating unit 4. That is, the actuation of the driving unit 41 causes the workpiece W to rotate, while at the same time, the actuation of the driving unit 51 causes the turning member 52 to turn, thereby revolving the workpiece W. The mechanism control unit 60 of the control apparatus 6 sets the rotation speed to be faster than the revolution speed. By rotating and revolving simultaneously, the workpiece W is repeatedly located at a position coming close to the target 21 and a position moving apart therefrom.

When the power supply unit 3 applies power to the target 21, the sputtering gas in the vacuum chamber 11 generates plasma. In the sputter source 2, ions produced by the plasma collide with the target 21 to drive out particles. Hence, the particles of the film formation material are deposited on the film formation subjected surface Wa of the workpiece W and the film formation subjected surface Wb thereof, and thus films are formed thereon. For example, a titanium or silicon film is formed.

(Principle of Uniform Film Formation)

Figure 5:
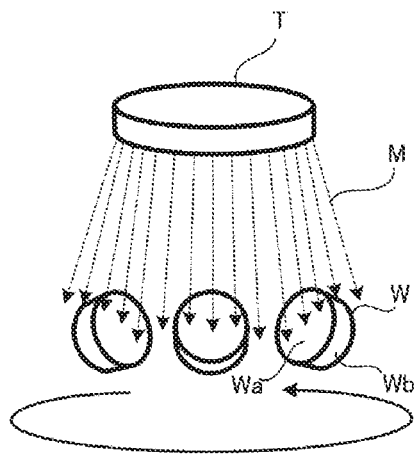
FIG. 5 is a simplified side view illustrating a rotation and a revolution of the workpiece relative to the horizontal target.
Figure 6:
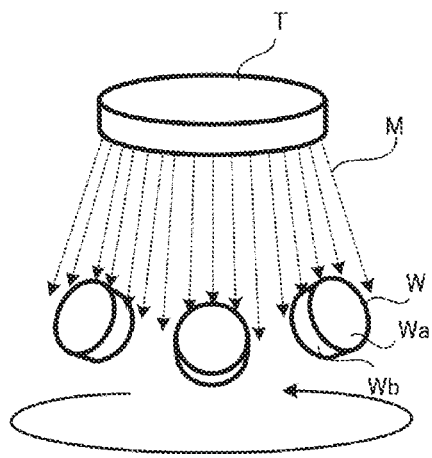
FIG. 6 is a simplified side view illustrating the rotation and the revolution of the workpiece relative to the horizontal target.

First, an explanation will be given of the reason why films that have a uniform thickness are not formed on the film formation subjected surfaces Wa, Wb when the target is disposed over the revolution trajectory surface of the workpiece and in parallel with the revolution trajectory surface, and the workpiece W is inclined, rotated and revolved during the film formation with reference to FIGS. 5, 6 illustrating the rotation of the workpiece W and the revolution thereof. FIGS. 5, 6 illustrate cases in which film formation is performed on the film formation subjected surfaces Wa, Wb of the above workpiece W by a horizontally disposed target T.

As illustrated in FIG. 5, when the workpiece W is inclined and revolved while being rotated so as the film formation subjected surface Wa is directed internally and upwardly relative to the horizontally disposed target T, the distance from the workpiece W to the target T is constant, and thus the film formation subjected surface Wa is always faced toward the target T. In addition, the film formation subjected surface Wa is always within the emission range of a film formation material M driven out from the target T, as indicated by dashed arrows. Hence, the film formation amount per a unit time becomes quite large.

In addition, the film formation subjected surface Wb moves apart from the target T more than the film formation subjected surface Wa, and has a part hidden behind the emission range of the film formation material M from the target T, during the rotation and the revolution. By the rotation of the workpiece W, the surface portion of the film formation subjected surface Wb facing towards the target changes in sequence. Hence, although the film formation amount is dispersed and averaged across the whole circumference, the difference in the film formation amount relative to the film formation subjected surface Wa increases.

On the other hand, as illustrated in FIG. 6, in an opposite way to FIG. 5, the angle of the workpiece W is changed, and the workpiece W is inclined, rotated and revolved so as the film formation subjected surface Wa is directed outwardly and upwardly. In this case, the distance from the workpiece W to the target T constant, and a part of the film formation subjected surface Wb is always facing the target T substantially from the front, in another word, in an opposing condition. Hence, the film formation amount per a unit time to the film formation subjected surface Wb becomes larger than that of the film formation subjected surface Wa. This is because the surface portion of the film formation subjected surface Wb facing the target T changes in sequence by the rotation of the workpiece W, and thus a part where the film formation amount is large is dispersed and averaged across the whole circumference. However, the film formation subjected surface Wa always has a large inclination relative to the target T, and the film formation amount remains always small. Hence, the difference in the film formation amount between the film formation subjected surfaces Wa, Wb increases.

Next, an explanation will be given of the principle of unifying the film formation on the film formation subjected surfaces Wa, Wb according to the embodiment with reference to, in addition to FIGS. 2, 3, FIGS. 7, 8 illustrating the rotation of the workpiece W and the revolution thereof in the film formation.

Figure 7:
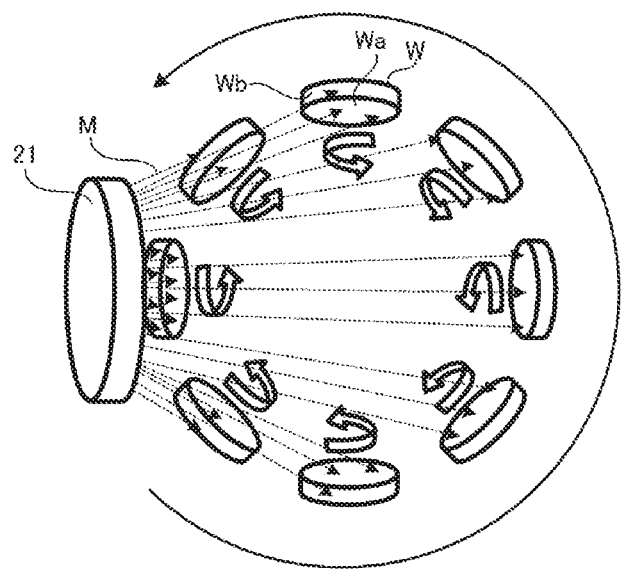
FIG. 7 is a simplified plane view illustrating the rotation and the revolution of the workpiece according to an embodiment.

As illustrated in FIG. 2, the film formation subjected surface Wa faces the plane SU3 of the target 21 in a parallel or substantially parallel condition at the most distant position from the target 21. Hence, although the film formation subjected surface Wa faces the target 21, the film formation amount per a unit time is relatively small. In addition, as illustrated in FIG. 3, when the film formation subjected surface Wa comes in the closest position to the target 21, this film formation subjected surface faces the plane SU3 of the target 21 at a large inclination angle. Hence, even the distance to the target 21 becomes short, the Film formation amount per a unit time is relatively small. However, as illustrated in FIG. 7, the film formation subjected surface Wa of the workpiece W is always within the emission range of the film formation material M from the target 21 during the rotation and the revolution, and is always facing toward the target 21. Hence, a film formation time for the film formation subjected surface Wa is long. Accordingly, the overall film formation amount is ensured. In addition, since the target 21 is rotating, the film formation amount is dispersed and averaged across the whole film formation subjected surface Wa, and thus the film thickness becomes uniform.

Figure 8:
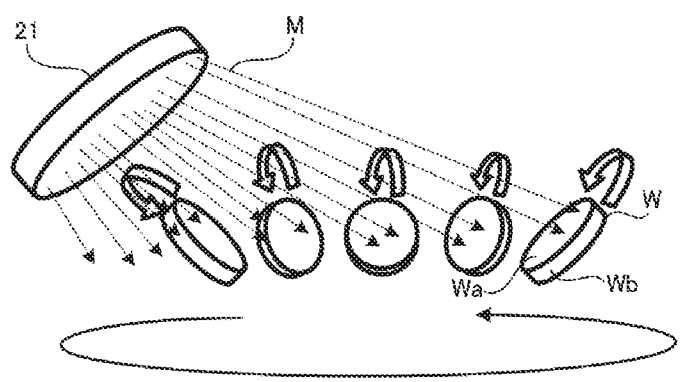
FIG. 8 is a simplified side view illustrating the rotation and the revolution of the workpiece according to an embodiment.

On the other hand, as illustrated in FIG. 3, the film formation subjected surface Wb faces the plane SU3 of the target 21 in a parallel or substantially parallel condition at the closest position to the target 21, and the film formation amount per a unit time at this position is quite large. In addition, as illustrated in FIG. 2, when the film formation subjected surface Wb comes the most distant position from the target 21, this film formation subjected surface faces the plane SU3 of the target 21 at a large inclination angle, and thus the film formation amount per a unit time is quite small. As explained above, although the film formation amount for the film formation subjected surface Wb largely varies depending on the position over the revolution trajectory, the film formation subjected surface Wb to be facing toward the target 21 during the revolution always changes since the workpiece W is rotating. Hence, the difference in the film formation amount depending on the difference in the distance is eliminated. In addition, as illustrated in FIG. 8, the film formation subjected surface Wb of the workpiece W has a part hidden behind the emission range of the film formation material M from the plane SU3 of the target 21 during the rotation and the revolution. However, as explained above, since the workpiece W is rotating, the surface that faces the target 21 changes in sequence, and the film formation amount is dispersed and averaged across the whole circumference. Accordingly, the film thickness becomes uniform.

In this way, as for the film formation subjected surface Wa, the film formation amount per a unit time is reduced as explained above since the film formation time is long. Conversely, as for the film formation subjected surface Wb, a timing, which the film formation amount per a unit time becomes quite large, is given since there is a time at which the film formation subjected surface Wb is not facing toward the target 21, compensating the insufficiency of the film formation time. Hence, the film formation subjected surface Wa and the film formation subjected surface Wb eventually fall in the similar film thickness, and thus a uniform film thickness is achieved on the film formation subjected surfaces Wa, Wb of the workpiece W as a whole.

(Exemplary Angle Setting)

A preferable exemplary angle setting for each component according to the embodiment will be explained. First, a first inclination angle $\theta 1$ is an angle that makes the rotation axis AX1 to be not in parallel with the plane SU3 of the target 21 at a position where the rotating unit 4 comes closest to the target 21. In addition, the first inclination angle $\theta 1$ is an angle that makes the rotation trajectory surface SU1 to be in parallel with the plane SU3 of the target 21 at a position where the rotating unit 4 becomes most distant from the target 21. Note that in this example, the rotation axis AX1 is provided along the plane which passes through the revolution axis AX2, and is orthogonal to the revolution trajectory surface SU2. Hence, in order to achieve the condition in which the rotation trajectory surface SU1 and the plane SU3 are in parallel with each other at the most distant position, it is appropriate if the first inclination angle $\theta 1$ and a second inclination angle $\theta 2$ are consistent with each other.

Next, the workpiece W is supported at an angle that makes the single film formation subjected surface Wa to be orthogonal to the rotation axis AX1. That is, the workpiece W is attached to the turning shaft of the driving unit 41 in such way that the film formation subjected surface Wa has an orthogonal angle to the rotation axis AX1. Hence, the workpiece W supported by the rotation axis AX1 has the film formation subjected surface Wa that is a plane with an angle parallel with the rotation trajectory surface SU1, and has the film formation subjected surface Wb that is a plane with an angle orthogonal to the rotation trajectory surface SU1. It is desirable to suppress an off-centering of the turning by setting the weight center of the film formation subjected surface Wa to the turning center of the workpiece W.

In this case, the film formation subjected surface Wa becomes aligned on the same line or in parallel with the rotation trajectory surface SU1. Hence, as illustrated in FIG. 2, when the workpiece W comes at the most distant position from the target 21, the film formation subjected surface Wa becomes in parallel with the plane SU3 of the target 21. In addition, as illustrated in FIG. 3, when the workpiece W comes at the closest position to the target 21, the film formation subjected surface Wb parallel to the rotation axis AX1 faces the plane SU3 of the target 21 at an inclination angle, and the film formation subjected surface Wa orthogonal thereto also faces the plane SU3 of the target 21 at an inclination angle.

When the above angle setting is adopted, as illustrated in FIG. 2, when the workpiece W comes at the most distant position from the plane SU3 of the target 21, the film formation subjected surface Wa becomes in parallel with the plane SU3 of the target 21, and the film formation subjected surface Wb has an orthogonal angle. In addition, as illustrated in FIG. 3, when the workpiece W comes at the closest position to the plane SU3 of the target 21, the film formation subjected surface Wb has an angle substantially parallel to the plane SU3 of the target 21, and the film formation subjected surface Wa faces the plane SU3 of the target 21 at the larger inclination angle than that of the film formation subjected surface Wb.

Accordingly, when sputtering is performed while changing the respective angles of the film formation subjected surfaces Wa, Wb and the distances thereof relative to the plane SU3 of the target 21, as explained above, the difference in the film formation amount between the film formation subjected surface Wa and the film formation subjected surface Wb is eliminated, and thus a film that has a uniform thickness as a whole is formed.

(Test Results)

The test results of such film formation process will be explained with reference to FIG. 9. In the tests, the film formation subjected surface Wa of the workpiece W is defined as the upper surface, while the film formation subjected surface Wb is defined as the side surface. First, a comparative example is a case in which the first inclination angle θ1 was zero degree, the second inclination angle θ2 was zero degree, and the angle between the rotation trajectory surface SU1 and the plane SU3 of the target 21 was 180 degrees. In this case, the upper surface of the workpiece W was always in parallel with the plane SU3 of the target 21. Then, a quite thick film would be formed on the upper surface of the workpiece W. This will be shown by a "cross mark" in FIG. 9 which indicates that the film formation is not uniform.

On the other hand, a first example was a case in which the first inclination angle θ1 was 40 degrees, the second inclination angle θ2 was 40 degrees, and the angle (indicated as α in FIG. 3) between the rotation trajectory surface all and the plane SU3 of the target 21, when the workpiece W came at the closest position to the target 21, was 100 degrees. In this case, when the rotating unit 4 came to the closest position to the target 21, both the upper surface and the side surface of the workpiece W faced the plane SU3 of the target 21 with an inclination angle. In addition, the side surface was substantially parallel so the plane SU3, while the upper surface had a large inclination relative to the plane SU3. Hence, as explained in the above embodiment, a uniform film would be formed on the upper surface of the workpiece W and the side surface thereof. This will be shown by a "double circle" in FIG. 9 which indicates a quite excellent uniformity of film formation.

A second example was a case in which the first inclination angle θ1 was 45 degrees, the second inclination angle θ2 was 45 degrees, and the angle α between the rotation trajectory surface SU1 and the plane SU3 of the target 21, when the workpiece W came at the closest position to the target 21, was 90 degrees. In this case, when the workpiece W came at the closest position to the target 21, the side surface of the workpiece W became in parallel with the plane SU3 of the target 21, but the upper surface had an orthogonal angle. Accordingly, although the film thickness at the side surface of the workpiece W would be slightly thicker than the film thickness at the upper surface, the overall film thickness would be considered as substantially uniform. This will be shown by a "circle" in FIG. 9 which indicates that the uniformity of film formation is excellent.

In view of the above results, when the first inclination angle θ1 and the second inclination angle θ2 are set to 40 degrees, the most uniform film formation on both the upper surface and the side surface can be obtained. However, the required uniformity varies depending on the product. Hence, it is preferable to set the first inclination angle θ1 and the second inclination angle θ2 to be greater than zero degree and equal to or smaller than 45 degrees. In addition, by changing the setting for the first inclination angle θ1 and that for the second inclination angle θ2 within this range, the film thickness ratio between the upper surface and the side surface can be adjusted.

[Effects]

According to the embodiment explained above, the target 21 that is a film formation material including the plane SU3, the power supply unit 3 that applies power to the target 21, the rotating unit 4 that rotates the workpiece W around the rotation axis AX1, and the revolving unit 5 that revolves the rotating unit 4 around the revolution axis AX2 separate from the rotation axis AX1 to make the workpiece W to come close to and move apart from the target 21 are provided. The rotation axis AX1 during the rotation and the revolution is fixed at an angle that makes the rotation trajectory surface SU1 orthogonal thereto to have the first inclination angle θ1 relative to the revolution trajectory surface SU2 orthogonal to the revolution axis AX2, and the target 21 is fixed at an angle that makes the plane SU3 to have the second inclination angle θ2 relative to the revolution trajectory surface SU2.

According to the embodiment explained above, the rotation axis AX1 of the rotating unit 4 that rotates the workpiece W and the plane SU3 of the target 21 are inclined relative to the revolution trajectory surface SU2, and thus a film formation is performed while the rotating workpiece W changes the distance between the workpiece W and the plane SU3 of the target 21 by repeatedly coming close to and moving apart from the plane SU3 of the target 21 and changing the angle of the workpiece relative to the the plane SU3 of the target 21. Hence, the film formation amount is dispersed entirely on the film formation subjected surfaces Wa, Wb, and thus a uniform film formation can be obtained.

In addition, although a structure is employed in which the film formation is performed while changing the angle of the workpiece W relative to the plane SU3 of the target 21, the first inclination angle during the rotation and the revolution is unchanged. Hence, a complicated structure that needs an angle adjustment during the film formation is avoided, and a uniform film formation can be obtained by a simple structure.

In particular, according to the embodiment, the first inclination angle θ1 is set to an angle that makes the rotation axis AX1 to not be in parallel to the plane SU3 of the target 21 at a location where the rotating unit 4 comes closest to the target 21. Hence, both of the film formation subjected surfaces Wa, Wb do not have an angle orthogonal to the plane SU3 of the target 21 but faces the target 21 in an inclined condition, even at the location where the workpiece W comes closest to the target 21 in which the film formation amount becomes quite large. Accordingly, an occasion in which a film is not formed on either of the film formation subjected surface Wa, Wb is avoided, and the film formation amount becomes further uniform overall.

In addition, according to the embodiment, the first inclination angle θ1 is an angle that makes the rotation trajectory surface SU1 to be in parallel with the plane SU3 of the target 21 at a location where the rotating unit 4 is most distant from the target 21. When the workpiece W is apart from the target 21, the overall film formation amount becomes small. Hence, even if the angle between the film formation subjected surface Wa or Wb and the plane SU3 of the target 21 is different, the difference in film formation amount to the film formation subjected surfaces Wa, Wb is little, and thus a film is formed uniformly as a whole.

Still further, according to the embodiment, the first inclination angle θ1 and the second inclination angle θ2 are consistent with each other. Hence, it is appropriate if the angle of the rotation trajectory surface SU1 of the rotating unit 4 is adjusted to the same angle of the target 21, and thus the design work for the film formation apparatus 100 and the adjustment work thereof are facilitated.

Yet still further, according to the embodiment, the rotation speed of the workpiece W by the rotating unit 4 is faster than the revolution speed of the workpiece W by the revolving unit 5. That is, the workpiece W rotates more than 1 time while the workpiece w revolves 1 time. Hence, a variability in time which the film formation subjected surfaces Wa, Wb of the workpiece W face the target 21 is eliminated, and thus an overall uniform film thickness is achieved. Note that the rotation speed of the workpiece W is faster than the revolution speed thereof, and may be a speed that is not integral multiple of the revolution speed, for example 2.1 times or 2.3 times. By setting the rotation speed in this manner, for example, every time the workpiece W comes the closest location to the target 21 by the revolution, a different surface portion of the film formation subjected surface Wb of the workpiece W faces the plane SU3 of the target 21. Hence, the unbalanced film formation on the film formation subjected surfaces Wa, Wb is further reduced.

Other Embodiments

The present disclosure is not limited to the above embodiment, and also covers the following aspects.

Figure 10:
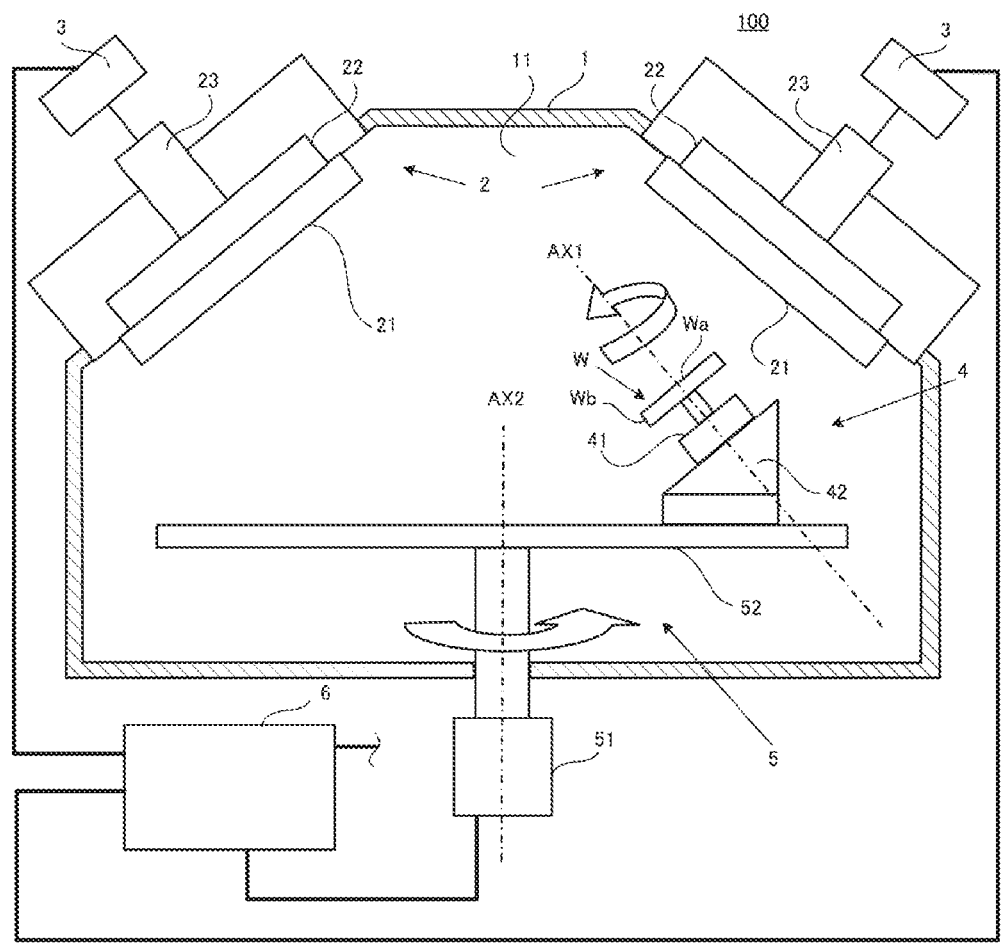
FIG. 10 is a simplified cross-sectional view illustrating a case in which a plurality of targets is provided.

(1) A plurality of targets may be provided. Since the rotating and revolving workpiece repeatedly changes the angle and the distance relative to each target like the embodiment above, a slight difference in position, angle, characteristic, etc., of each target is eliminated, facilitating an overall uniform film formation. In addition, a film formation process to a single workpiece is speeded up. In this case, also, each target, the rotating unit and the revolving unit are structured to satisfy the relationship between the first inclination angle and the second inclination angle for each target. For example, as illustrated in FIG. 10, pairs of respective sputter sources 2 and respective power supply units 3 may be located to satisfy a symmetrical relationship relative to the revolution axis AX2. The number of targets is not limited to two, and may be equal to or greater than three. In addition, the plurality of targets may be disposed at an equal pitch or at a random pitch on the circumference around the revolution axis AX2.

Figure 11:
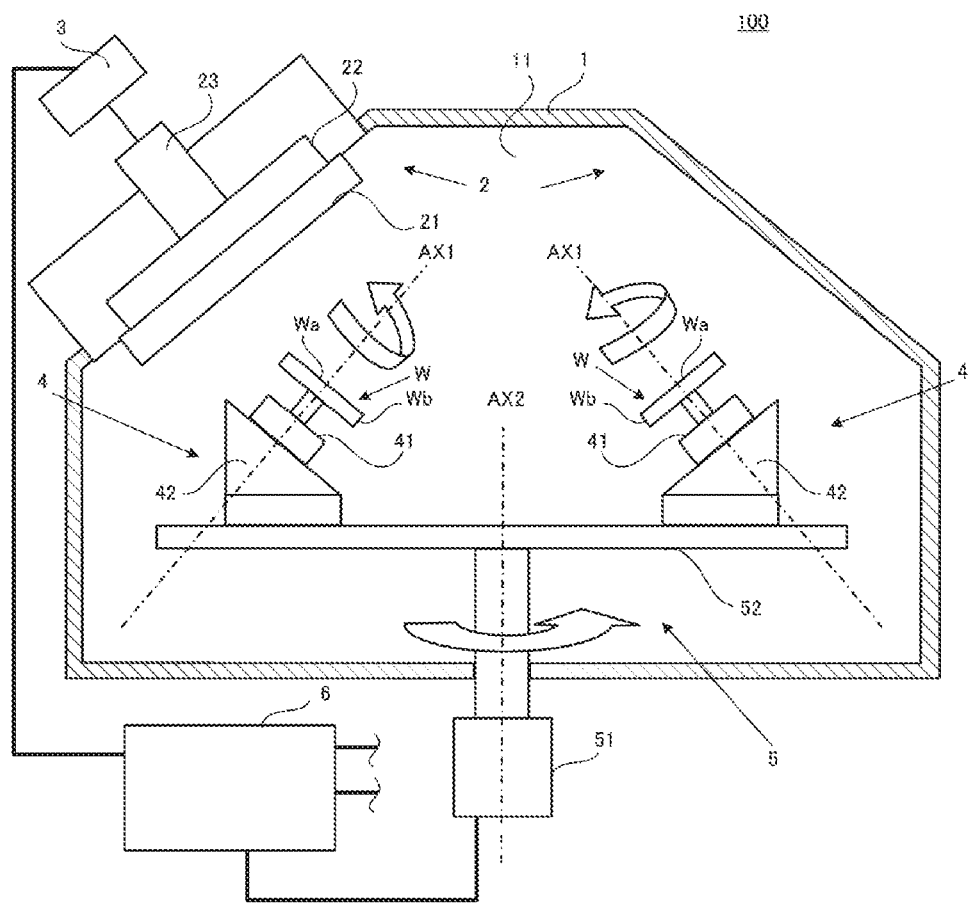
FIG. 11 is a simplified cross-sectional view illustrating a case in which a plurality of rotating units is provided.

In addition, a plurality of rotating units may be provided. This improves the manufacturing efficiency of the workpiece subjected to film formation. In this case, also, the target, each rotating unit and the revolving unit are structured to satisfy the relationship between the first inclination angle and the second inclination angle for each rotating unit. For example, as illustrated in FIG. 11, a pair of rotating units 4 may be located to satisfy a symmetrical relationship relative to the revolution axis AX2. Note that the number of rotating units is not limited to two, and may be equal to or greater than three.

Figure 12:
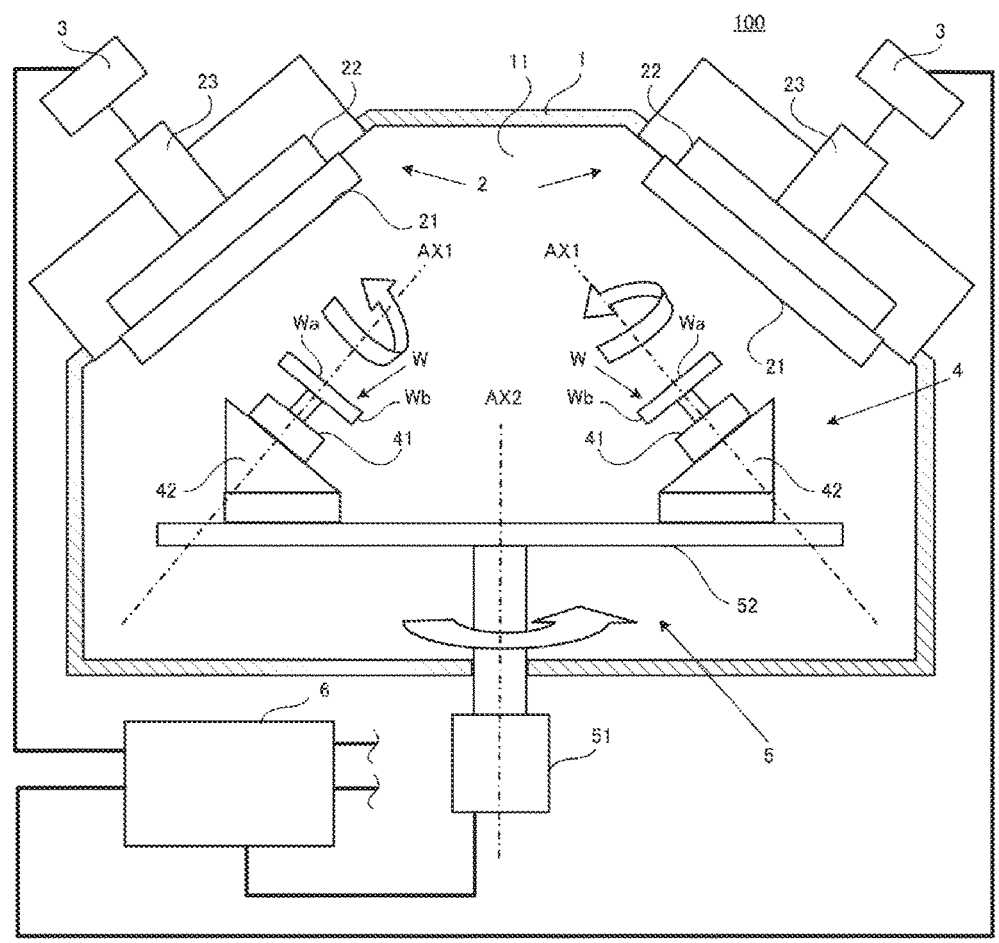
FIG. 12 is a simplified cross-sectional view illustrating a case in which the plurality of targets and rotating units are provided.

Still further, a plurality of targets and a plurality of rotating units may be provided. In this case, also, each target, each rotating unit and the revolving unit are structures to satisfy the relationship between the first inclination angle and the second inclination angle for each target and for each rotating unit. For example, as illustrated in FIG. 12, a pair of targets 21 and a pair of rotating units 4 may be located so as to satisfy symmetrical relationship relative to the revolution axis AX2. The number of targets and that of rotating units are not limited to two, and may be equal to or greater than three.

When both the target and the rotating unit, or either one of them is provided by multiple number as explained above, the design work is easy since the relationship between the first inclination angle and the second inclination angle is commonly applicable to the respective targets and the respective rotating units. When the first inclination angle and the second inclination angle are consistent, the design work becomes far more easier. In addition, the control structure can be simplified in comparison with a case in which the first inclination angle is changed in the film formation. Accordingly, even if the large number of targets or rotating units is provided, a complicated control structure is avoidable.

(2) The first inclination angle may be variable. The rotation axis may be provided so as to change the angle relative to the revolving unit, and the first inclination angle of the rotation axis may be changed prior to the film formation process. That is, as long as the first inclination angle is an angle that makes different film formation subjected surfaces to face the plane of the target in respective inclined conditions when the workpiece came close, the first inclination angle does not need to be always consistent with the second inclination angle. The angle may be made variable by, for example, providing the support of the rotating unit turnable around the revolution member of the revolving unit, or by forming the support of a flexible member. In this case, also, the first inclination angle is unchanged during the revolution and the rotation.

(3) The structure of the revolving unit and the support structure thereof relative to the rotating unit are not limited to the above structures. The turning member of the revolving unit may be a bar-shape arm that extends in the radial direction of a turn. In addition, as for the support of the rotating unit, a bar-shape arm continuous from the revolving unit, or connected thereto and standing upright, may support the driving unit.

Still further, the rotating unit 4 may have a variable position in the orthogonal direction to the revolution axis. That is, by changing the position of the radial direction of the revolution of the rotation unit the rotating unit in radial direction of rotation while maintaining the relationship between the first inclination angle and the second inclination angle, the film formation condition can be changed. For example, the rotating unit may be provided to be slidable in the radial direction of the turning member of the revolving unit, and may be tentatively immobilized at a desired position. According to this structure, by causing the position of the rotating unit to be close to the revolution axis, a film thickness difference between a case in which the workpiece comes close to the target and a case in which the workpiece moves apart therefrom is reduced. Accordingly, even in the case of 45 degrees shown in the above second example, a tendency that the film thickness on the side surface slightly becoming thick is prevented, thereby enabling uniform film formation.

The driving unit of the rotating unit and that of the revolving unit may employ a direct drive mechanism for the turning shaft by a motor, a gear drive mechanism or a belt drive mechanism for the turning shaft by a drive source that is a motor. As for the attachment scheme of the workpiece to the rotation axis of the rotating unit, any conventionally well-known technologies are applicable. The film thickness varies depending on the attachment angle of the workpiece relative to the rotation axis. However, in order to achieve a constant film formation result that has no variability in each workpiece, it is desirable to attach at an angle that makes a single film formation subjected surface to be orthogonal to the rotation axis. In addition, by adjusting the rotation speed, and the revolution speed, the film formation condition is also changeable.

(4) The shape of the workpiece subjected to the film formation is not limited to the examples explained in the above embodiment. In the above embodiment, the explanation has been given of an example case in which films are formed by the sputtering on two surfaces that are the film formation subjected surface Wa which is a plane, and the film formation subjected surface Wb which is a curved surface. As explained above, the workpiece can be considered as a three-dimensional object that has film formation subjected surfaces corresponding to a plurality of projection surfaces, respectively.

Figure 13:
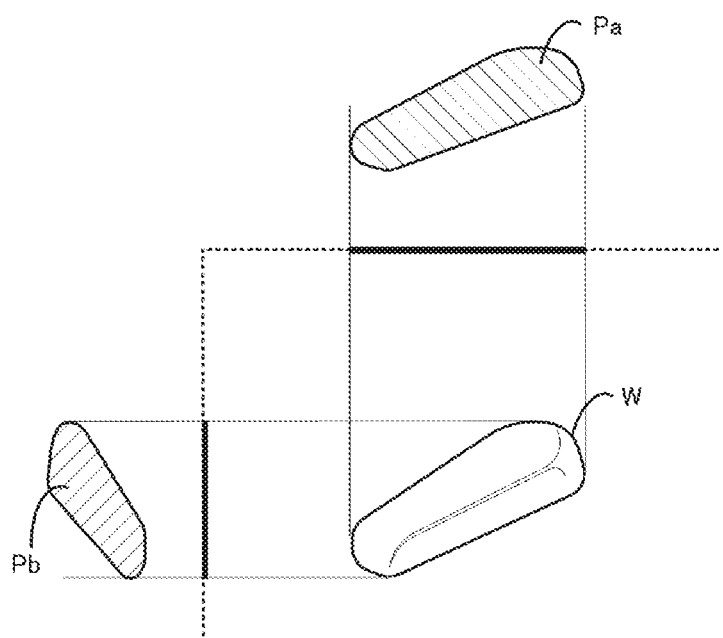
FIG. 13 is an explanatory diagram illustrating an example workpiece that is a three-dimensional object.

When, for example, as illustrated in FIG. 13, the workpiece W is a three-dimensional object formed in a shape that is not a simple shape, two orthogonal projection surfaces Pa, Pb are formed by a projection from the orthogonal two directions. When the projection surface Pa faces the target, the surface of the workpiece W corresponding to the projection surface Pa substantially becomes the film formation subjected surface. When the projection surface Pb faces the target, the surface of the workpiece W corresponding to the projection surface Pb substantially becomes the film formation subjected surface. Since the workpiece W rotates, the projection surface facing towards the workpiece W changes between Pa and Pb in non-step.

However, depending on various conditions, such as the angle of the plane of the target, and the attachment angle of the workpiece W to the turning shaft, the shape of the projection surface varies. In addition, depending on the various conditions, such as applied power, the amount and kind of sputtering gas, the size of the target and the material thereof, also, the emission range of the film formation material varies. Hence, the projection surface and the film formation surface are changed in accordance with various conditions.

As explained above, the workpiece that is a three-dimensional object may include a polygonal body, a curved surface body, and a composite body, and may be in a concavo-convex shape. The boundary of when there are a plurality of film formation surfaces to the workpiece may be edged or rounded. There may be no so-called boundary between the film formation subjected surfaces and such surfaces may be continuous, and may be surfaces each having a portion with a different angle. Still further, the shape of the entire workpiece and the shape of the film formation subjected surface may be unsymmetrical shape with reference to a certain axis. Moreover, when, for example, the film formation subjected surface is a curved surface, and is attached at an orthogonal angle to the rotation axis, the angle of the film formation subjected surface orthogonal to the rotation axis is set in the tangential direction of the curved surface or the projection surface direction.

REFERENCE SIGNS LIST

1 Chamber
2 Sputter source
3 Power supply unit
4 Rotating unit
5 Revolving unit
6 Control apparatus
11 Vacuum chamber
21 Target
22 Backing plate
23 Electrode
41 Driving unit
42 Support
51 Driving unit
52 Turning member
60 Mechanism control unit
61 Memory unit
62 Setting unit
63 Input-output control unit
64 Input hardware
65 Output hardware
100 Film formation apparatus
AX1 Rotation axis
AX2 Revolution axis
M Film formation material
SU1 Rotation trajectory surface
SU2 Revolution trajectory surface
SU3 Plane
Wa, Wb Film formation subjected surface
θ1 First inclination angle
θ2 Second inclination angle

The invention claimed is:
1. A film formation apparatus comprising:
a target that is a film formation material including a plane;
a power supply unit applying power to the target;
a rotating unit rotating a workpiece around a rotation axis, the workpiece being a film formation object and having a first film formation surface and a second film formation surface which intersects with the first film formation surface, and the rotation axis having an axial line intersecting the first film formation surface; and
a revolving unit revolving the rotating unit around a revolution axis separate from the rotation axis to repeatedly make the workpiece to come close to and move apart from the target,
wherein:
the rotation axis in the rotation and the revolution is fixed at a predetermined angle;
the predetermined angle is an angle at which a rotation trajectory surface has a first inclination angle relative to a revolution trajectory surface;
the rotation trajectory surface is a plane orthogonal to the rotation axis;
the revolution trajectory surface is a plane orthogonal to the revolution axis;
the target is held at an angle that causes the plane of the target to have a second inclination angle relative to the revolution trajectory surface;
the first inclination angle is an acute angle;
the second inclination angle is an acute angle; and
the rotation trajectory surface including the first film formation surface is inclined so that the first film formation surface faces inwardly toward the revolution axis and faces upwardly toward the revolution axis.

2. The film formation apparatus according to claim 1, wherein the first inclination angle is an angle that makes the rotation axis to be not in parallel with the plane of the target at a position where the rotating unit comes the closest to the target.

3. The film formation apparatus according to claim 1, wherein the first inclination angle is an angle that makes the rotation trajectory surface to be in parallel with the plane of the target at a position where the rotating unit becomes most distant from the target.

4. The film formation apparatus according to claim 1, wherein the first inclination angle and the second inclination angle are a same angle.

5. The film formation apparatus according to claim 1, wherein a rotation speed of the workpiece by the rotating unit is faster than a revolution speed of the workpiece by the revolution unit.

6. The film formation apparatus according to claim 1, wherein a plurality of the targets is provided.

7. The film formation apparatus according to claim 1, wherein a plurality of the rotating units is provided.

8. The film formation apparatus according to claim 1, wherein the rotating unit has a variable position in a direction orthogonal to the revolution axis.

9. The film formation apparatus according to claim 1, wherein the first inclination angle is variable.

10. A film-formed workpiece manufacturing method comprising:
- a step of rotating a workpiece around a rotation axis, the workpiece being a film formation object and having a first film formation surface and a second film formation surface which intersects with the first film formation surface and the rotation axis having an axial line intersecting the first film formation surface, and revolving the rotating unit by a revolving unit that supports the rotating unit around a revolution axis separate from the rotation axis; and
- a step of applying power to a target that is a film formation material from a power supply unit to generate plasma from a sputtering gas introduced around a plane of the target, and depositing the film formation material on the first film formation surface and the second film formation surface, wherein:
the rotation axis in the rotation and the revolution is fixed to a predetermined angle;
the predetermined angle is an angle at which a rotation trajectory surface has a first inclination angle relative to a revolution trajectory surface;
the rotation trajectory surface is a plane orthogonal to the rotation axis;
the revolution trajectory surface is a plane orthogonal to the revolution axis;
the target is held at an angle that causes the plane of the target to have a second inclination angle relative to the revolution trajectory surface;
the first inclination angle is an acute angle;
the second inclination angle is an acute angle; and
the rotation trajectory surface including the first film formation surface is inclined so that the first film formation surface faces inwardly toward the revolution axis and faces upwardly toward the revolution axis.

11. The film-formed workpiece manufacturing method according to claim 10, wherein the revolving unit revolves the rotating unit to make the workpiece to repeatedly come close to and move apart from the target.

12. The film-formed workpiece manufacturing method according to claim 10, wherein the first inclination angle is an angle that makes the rotation axis to be not in parallel with the plane of the target at a position where the rotating unit comes the closest to the target.

13. The film-formed workpiece manufacturing method according to claim 10, wherein the first inclination angle is an angle that makes the rotation trajectory surface to be in parallel with the plane of the target at a position where the rotating unit becomes most distant from the target.

14. The film-formed workpiece manufacturing method according to claim 10, wherein the workpiece supported by the rotation axis comprises a film formation object that contains a surface with a parallel angle to the rotation trajectory surface, and a surface with an angle orthogonal to the rotation trajectory surface.

15. The film formation apparatus according to claim 1, wherein:
the first inclination angle is 40 to 45 degrees, and
the second inclination angle is 40 to 45 degrees.

16. The film-formed workpiece manufacturing method according to claim 10, wherein:
the first inclination angle is 40 to 45 degrees, and
the second inclination angle is 40 to 45 degrees.

* * * * *